(12) United States Patent
Tanji et al.

(10) Patent No.: US 8,860,506 B2
(45) Date of Patent: Oct. 14, 2014

(54) AMPLIFYING APPARATUS

(75) Inventors: Kouki Tanji, Yokohama (JP); Eiichiro Otobe, Yokohama (JP)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 20 days.

(21) Appl. No.: 13/610,538

(22) Filed: Sep. 11, 2012

(65) Prior Publication Data

US 2013/0147551 A1 Jun. 13, 2013

(30) Foreign Application Priority Data

Dec. 8, 2011 (JP) ................................ 2011-269200

(51) Int. Cl.
*H03F 1/14* (2006.01)
(52) U.S. Cl.
USPC ........................................................... 330/51
(58) Field of Classification Search
USPC ................. 330/51, 53, 84, 124 R, 286, 295
See application file for complete search history.

(56) References Cited

U.S. PATENT DOCUMENTS

| | | | |
|---|---|---|---|
| 5,832,305 A | | 11/1998 | Briggs et al. |
| 7,102,444 B2 * | | 9/2006 | Shanjani et al. ................. 330/51 |
| 7,135,919 B2 * | | 11/2006 | Chen ................................ 330/51 |
| 7,336,125 B2 * | | 2/2008 | Kyu et al. ......................... 330/51 |
| 7,486,133 B2 * | | 2/2009 | Bakalski .......................... 330/51 |
| 8,564,366 B2 * | | 10/2013 | Namie et al. .................... 330/51 |
| 2007/0096804 A1 * | | 5/2007 | Bakalski .......................... 330/51 |

FOREIGN PATENT DOCUMENTS

| | | |
|---|---|---|
| JP | 52-149954 | 12/1977 |
| JP | 7-307390 A | 11/1995 |
| JP | 2001-211090 A | 8/2001 |
| JP | 2002-185270 A | 6/2002 |
| JP | 2002-532883 A | 10/2002 |
| JP | 2007-013451 A | 1/2007 |
| WO | 00/35017 A1 | 6/2000 |

OTHER PUBLICATIONS

Japanese Office Action issued in Japanese Application No. 2011-269200 dated Feb. 4, 2014, w English translation.

* cited by examiner

*Primary Examiner* — Khanh V Nguyen
(74) *Attorney, Agent, or Firm* — McDermott Will & Emery LLP

(57) ABSTRACT

There is provided an amplifying apparatus which can prevent characteristic deterioration while reducing costs. The amplifying apparatus includes a first amplifier connected between an input terminal to which a high-frequency signal is input and an output terminal through which the high-frequency signal is output, including a bipolar transistor, and amplifying the high-frequency signal input from the input terminal; a second amplifier including a bipolar transistor, amplifying the high-frequency signal input from the input terminal, and having a lower maximum output power than that of the first amplifier; and a switching unit connected between the second amplifier and the output terminal, and selectively outputting the high-frequency signal amplified by the second amplifier through the output terminal.

3 Claims, 4 Drawing Sheets

AMPLIFYING APPARATUS

CROSS-REFERENCE TO RELATED APPLICATIONS

This application claims the priority of Japanese Patent Application No. 2011-269200 filed on Dec. 8, 2011, In the Japan Patent Office, the disclosure of which is incorporated herein by reference.

BACKGROUND OF THE INVENTION

1. Field of the Invention

The present invention relates to an amplifying apparatus.

2. Description of the Related Art

An amplifier used for amplifying high-frequency signals used in wireless communications generally has superior power added efficiency (PAE) in the vicinity of a maximum output. However, in a communications apparatus such as a mobile phone or the like in which the amplifier is used, use frequency at a maximum output level may be low, while use frequency at a relatively low output of about 10 dB to about 20 dB may be high.

For this reason, in the above-described communications apparatus, PAE having the low output of about 10 dB to about 20 dB greatly affects a continuous use time of a communications apparatus driven by internal power from a battery, or the like.

In this regard, technologies for switching an amplifier used in the amplification of high-frequency signals in accordance with output power required for an operation have been developed. As an example of technologies for switching a maximum output power for each of a plurality of operation modes, the following Related Art Document, may be provided as an example.

As a power amplifier, a high-performance bipolar transistor such as an InGaP heterojunction bipolar transistor (hereinafter, referred to as "HBT") or the like has been used.

Meanwhile, as a switch for switching the amplifier, a high electron mobility transistor (HEMT), a GaAs-based compound semiconductor has generally been used.

For this reason, such as an amplifying apparatus using technology disclosed in the following Related Art Document, an amplifying apparatus (or an amplifier module) that can switch the amplifier used in the amplification of high-frequency signals in accordance with the output power required for device operation is required to combine, for example, a plurality of semiconductor chips to thereby include the combined semiconductor chips, thereby causing an increase in manufacturing costs or unit size.

In addition, in recent years, a complex process that may configure the InGaP HBT and the HEMT as a single semiconductor chip has been developed.

However, since the above-described process is complex, an increase in costs may be caused when it is applied.

RELATED ART DOCUMENT

Japanese Patent Laid-Open Publication No. 2001-211090

SUMMARY OF THE INVENTION

An aspect of the present invention provides a new and improved amplifying apparatus that can prevent characteristic deterioration while achieving a reduction in manufacturing costs.

According to an aspect of the present invention, there is provided an amplifying apparatus including: a first amplifier connected between an input terminal to which a high-frequency signal is input and an output terminal through which the high-frequency signal is output, including a bipolar transistor, and amplifying the high-frequency signal input from the input terminal; a second amplifier including a bipolar transistor, amplifying the high-frequency signal input from the input terminal, and having a lower maximum output power than that of the first amplifier; and a switching unit connected between the second amplifier and the output terminal, and selectively outputting the high-frequency signal amplified by the second amplifier through the output terminal, wherein the switching unit includes an impedance transformer installed on a signal line between the second amplifier and the output terminal, and performing impedance conversion; a first bipolar transistor in which an emitter is grounded, a collector is connected to the signal line, and a current according to a control voltage for controlling a switching operation in the switching unit is applied to a base; and a second bipolar transistor in which a collector is grounded, an emitter is connected to the signal line, and the current according to the control voltage is applied to a base.

Due to this configuration, isolation may be ensured in each of a signal path relating to the first amplifier and a signal path relating to the second amplifier, and characteristic deterioration may be prevented. In addition, due to this configuration, as the first and second bipolar transistors included in the switching unit, an identical type bipolar transistor to the bipolar transistor included in the first amplifier or the second amplifier may be used. Accordingly, due to this configuration, characteristic deterioration may be prevented while a reduction in costs is achieved.

The switching unit may further include a capacitor of which one end is connected to the base of the second bipolar transistor, and the other end is grounded.

The bipolar transistors included in the first and second amplifiers, and the first and second bipolar transistors included in the switching unit, may be formed with a same semiconductor process.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
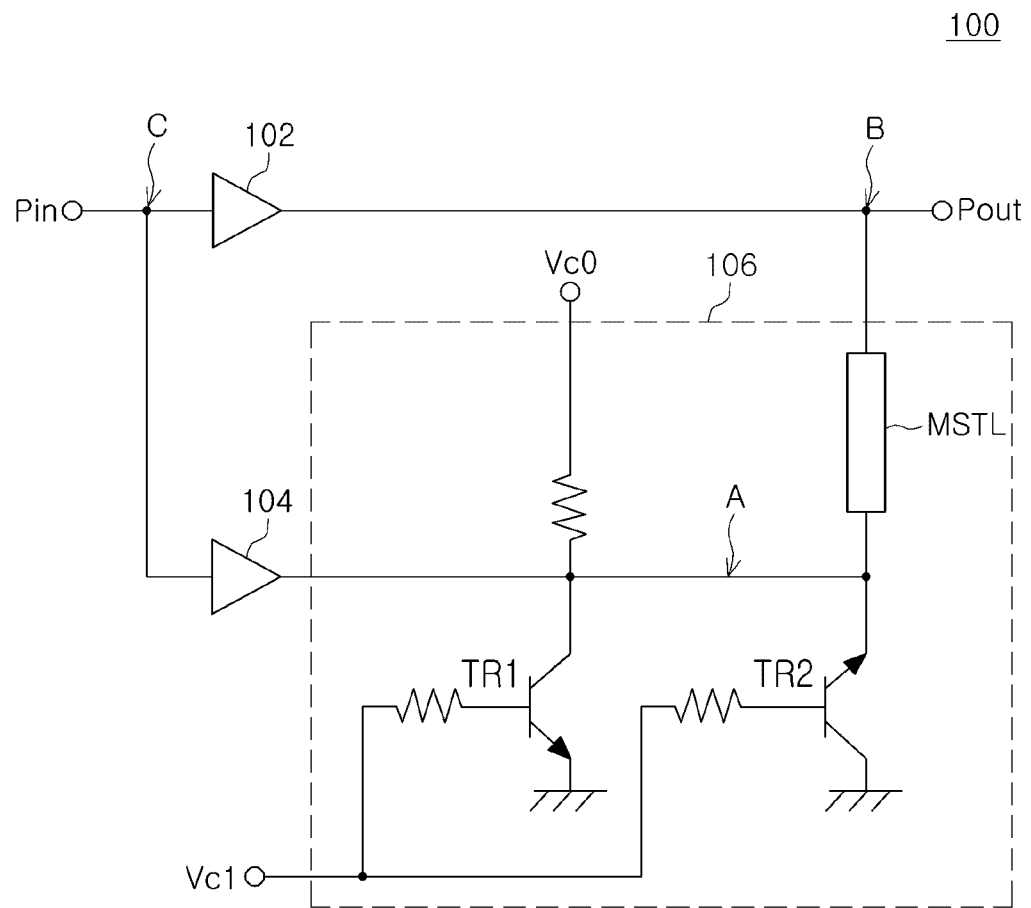
FIG. 1 is a circuit diagram illustrating an example of configurations of an amplifying apparatus according to a first embodiment of the present invention.

Hereinafter, embodiments of the present invention will now be described in detail with reference to the accompanying drawings. Like reference numerals designate like components having substantially the same constitution and function in the drawings of the present invention, and an overlapping description for the same component will be omitted.

When switching an amplifier used in amplification of high-frequency signals in accordance with output power required for operations, a configuration in which a high-frequency signal is amplified using a high power amplifier when a high power output is required, and a high-frequency signal is amplified using a medium power amplifier when a medium power output is required may be used. Here, when the above-described configuration is used, it may be appropriate that power of the medium power amplifier, turned off at the time of high power amplification never adversely affects a high power amplification path, and power of the high power amplifier, turned off at the time of medium power amplification never adversely affects a medium power amplification path.

However, when amplifiers having different output power are simply connected in parallel, deterioration in amplification characteristics in the amplifiers may occur by mutual impedance between the amplifiers due to a behavior of the high-frequency signal.

As a result, in the amplifying apparatus according to the embodiment of the present invention, the switching unit is provided at a connection point between the amplifiers, thereby ensuring mutual isolation and preventing characteristic deterioration.

Hereinafter, as the switching unit according to the embodiment of the present invention, a single pole single throw (SPST) switch for respectively switching one input and one output will be described on and off. In addition, for convenience of description, the SPST of one input and one output will be described, but the switching unit according to the embodiment of the present invention is not limited to the SPST switch. For example, the switching unit according to the embodiment of the present invention may be a switch for switching one input and at least two outputs on and off. The amplifying apparatus according to the embodiment of the present invention may include a variety of switches in such a manner as to include one or at least two switching units.

First Embodiment

FIG. 1 is a circuit diagram illustrating an example of configurations of an amplifying apparatus according to a first embodiment of the present invention.

The amplifying apparatus 100 includes an input terminal (Pin) to which a high-frequency signal is input, an output terminal (Pout) through which the high-frequency signal is output, a first amplifier 102, a second amplifier 104, and a switching unit 106.

Here, as the high-frequency signal according to the embodiment of the present invention, a frequency signal (for example, signals of 30 kHz to 300 GHz) which can be used in wireless communications such as long waves, medium waves, short waves, ultra short waves, ultra-high short waves, microwaves, millimeter waves, and the like may be used. In addition, the high-frequency signal according to the embodiment of the present invention is not limited thereto. For example, the high-frequency signal according to the embodiment of the present invention may be a frequency signal less than 30 kHz, or a frequency signal of 300 GHz or larger.

The first amplifier 102 is connected between the input terminal (Pin) and the output terminal (Pout). In addition, the first amplifier 102 includes a bipolar transistor, and amplifies the high-frequency signal input from the input terminal (Pin).

Here, as an example of the bipolar transistor constituting the first amplifier 102, a compound-based HBT (heterojunction bipolar transistor) such as InGaP HBT or InP HBT, CMOS-based (Complementary Metal Oxide Semiconductor) HBT such as SiGe HBT, or HBT in which a generally used process is used, such as SiGeBiCMOS in a complex process of SiGe HBT and bulk CMOS may be given. In addition, the bipolar transistor according to the embodiment of the present invention is not limited thereto.

In addition, when the first amplifier 102 can amplify a high-frequency signal while including a bipolar transistor, an arbitrary configuration may be used.

The second amplifier 104 includes a bipolar transistor, and amplifies the high-frequency signal input from the input terminal (Pin). In addition, a maximum output power of the second amplifier 104 is lower than that of the first amplifier 102. More specifically, the second amplifier 104 includes a transistor having a smaller size than that of the transistor included in the first amplifier 102. In addition, when the maximum output power of the second amplifier 104 according to the embodiment of the present invention is lower than that of the first amplifier 102, the second amplifier 104 may not include the transistor having a smaller size than that of the transistor included in the first amplifier 102. Hereinafter, an example in which a size of the transistor included in the second amplifier 104 is smaller than that of the transistor included in the first amplifier 102 will be described.

Here, as an example of the bipolar transistor constituting the second amplifier 104, in the similar manner as that of the bipolar transistor constituting the first amplifier 102, compound-based HBT such as InGaP HBT, Si-based HBT such as SiGe HBT, or HBT in which a generally used process is used, such as SiGeBiCMOS in a complex process of SiGe HBT and bulk CMOS may be given. In addition, the bipolar transistor constituting the second amplifier 104 may be formed with a same semiconductor process as that of used to form the bipolar transistor constituting the first amplifier 102.

In addition, as long as the second amplifier 104 can amplify a high-frequency signal while including the bipolar transistor therein, an arbitrary configuration may be used therefor.

In addition, a size of the transistor of the second amplifier 104 is set according to application of the second amplifier 104. More specifically, when the first amplifier 102 is an amplifier for high power amplification, the size of the transistor of the second amplifier 104 is set so as to correspond to medium power amplification or low power amplification, lower than a corresponding high power, and when the first amplifier 102 is an amplifier for medium power amplification, the size of the transistor of the second amplifier 104 is set so as to correspond to low power amplification, lower than a corresponding medium power.

The switching unit 106 is connected between the second amplifier 104 and the output terminal (Pout), and selectively outputs, through the output terminal (Pout), a high-frequency signal amplified by the second amplifier 104. In other words, the switching unit 106 may enable the second amplifier 104 to be selectively functioned.

[1] Configuration of Switching Unit 106

The switching unit 106 includes an impedance transformer (MSTL), a first bipolar transistor (TR1), and a second bipolar transistor (TR2).

In addition, in the switching unit 106, on and off switching operations are controlled according to a voltage level (high level/low level) of a control voltage (Vc0) and a control voltage (Vc1). More specifically, for example, when the voltage level of the control voltage (Vc0) is fixed as a high level, the switching unit 106 is turned on when the voltage level of the control voltage (Vc1) is a low level and when the voltage level of the control voltage (Vc0) is a high level.

The impedance transformer (MSTL) is installed on a signal line between the second amplifier 104 and the output terminal (Pout), and converts from high resistance to low resistance and from low resistance to high resistance.

Here, as an example of the impedance transformer (MSTL), a ¼ wavelength line of a use frequency may be given.

In the first bipolar transistor (TR1), an emitter is grounded, a collector is connected to a signal line, and a current according to the control voltage (Vc1) is applied to a base.

Here, as an example of the first bipolar transistor (TR1), compound-based HBT such as InGaP HBT or InP HBT, Si-based HBT such as SiGe HBT, or HBT in which a generally used process is used, such as SiGeBiCMOS in a complex process of SiGe HBT and bulk CMOS may be given. In addition, the present invention is not limited to the first bipolar transistor (TR1) described above according to the embodiment of the present invention. In addition, the switching unit 106 includes a bipolar transistor having the same type as that of the bipolar transistor constituting the first amplifier 102 or the second amplifier 104, as the first bipolar transistor (TR1).

In the second bipolar transistor (TR2), a collector is grounded, an emitter is connected to a signal line, and a current according to the control voltage (Vc1) is applied to a base.

Here, as an example of the second bipolar transistor (TR2), like the first bipolar transistor (TR1), compound-based HBT such as InGaP HBT or InP HBT, Si-based HBT such as SiGe HBT, or HBT in which a generally used process is used, such as SiGeBiCMOS in a complex process of SiGe HBT and bulk CMOS may be given. In addition, the present invention is not limited to the second bipolar transistor (TR2) described above according to the embodiment of the present invention. In addition, the switching unit 106 includes a bipolar transistor having the same type as that of the bipolar transistor constituting the first amplifier 102 or the second amplifier 104, as the second bipolar transistor (TR2).

[2] Example of Switching Operation in Switching Unit 106

Hereinafter, an example of a switching operation of the switching unit 106 will be described.

(1) When the switching unit 106 is turned off, in the case in which the first amplifier 102 is operated and the second amplifier 104 is not operated, the following may be provided.

For example, when a voltage level of the control voltage (Vc0) is a high level, and a voltage level of the control voltage (VC1) is a high level, the first bipolar transistor (TR1) and the second bipolar transistor (TR2) are turned on. In this instance, at a point (A) shown in FIG. 1, a short-circuit state with respect to the ground is obtained. In addition, by the impedance transformer (MSTL), an open state is obtained at a point (B) shown in FIG. 1, and a signal path relating to the second amplifier 104 does not affect a signal path relating to the first amplifier 102.

Here, in a case in which the switching unit 106 does not include the second bipolar transistor (TR2), plus amplitude of the high-frequency signal is short-circuited by the first bipolar transistor (TR1) at the point (A) shown in FIG. 1. However, in the case in which the switching unit 106 does not include the second bipolar transistor (TR2), a current of the first bipolar transistor (TR1) does not flow in the reverse direction with respect to minus amplitude of the high-frequency signal, and therefore the minus amplitude of the high-frequency signal is not short-circuited at the point (A) shown in FIG. 1.

On the other hand, the switching unit 106 according to the first embodiment of the present invention includes the second bipolar transistor (TR2) in which the emitter and the collector are connected in an opposite manner with respect to the first bipolar transistor (TR1) as shown in FIG. 1, and therefore, a current of minus amplitude may flow. Accordingly, the switching unit 106 may maintain a short-circuit state of the high-frequency signal at the point (A) shown in FIG. 1.

Figure 2A:
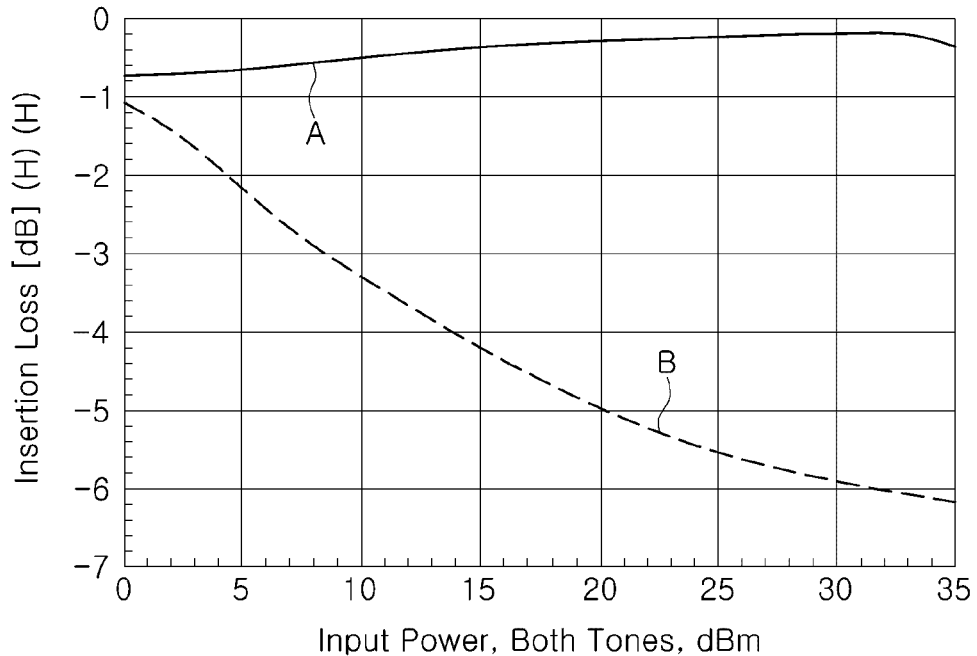
FIG. 2A is a graph illustrating effects of a second bipolar transistor included in a switching unit according to the first embodiment of the present invention.
Figure 2B:
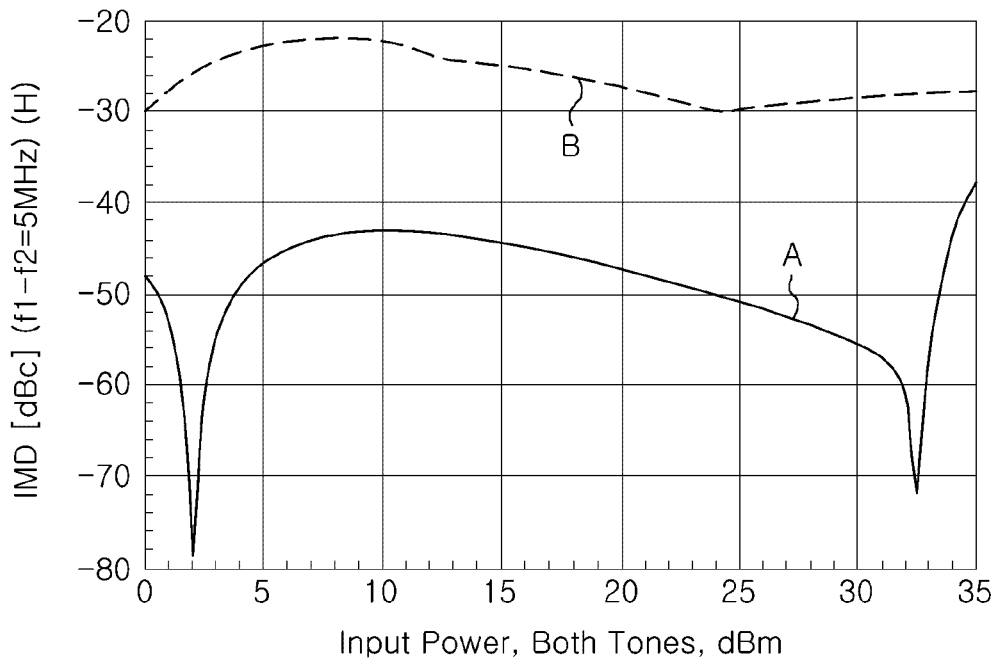
FIG. 2B is a graph illustrating effects of a second bipolar transistor included in a switching unit according to the first embodiment of the present invention.

FIGS. 2A and 2B are graphs illustrating effects of a second bipolar transistor (TR2) included in a switching unit according to the first embodiment of the present invention. In FIG. 2A, an insertion loss relationship with respect to a high-frequency signal power between the first amplifier 102 and the output terminal (Pout) is respectively shown in the case in which the switching unit includes the second bipolar transistor (TR2) and the switching unit does not include the second bipolar transistor (TR2). In addition, in FIG. 2B, a relationship of IMD (Inter Modulation Distortion) with respect to a high-frequency signal power between the first amplifier 102 and the output terminal (Pout) is respectively shown in the case in which the switching unit includes the second bipolar transistor (TR2) and the switching unit does not include the second bipolar transistor (TR2). Here, (A) shown in FIGS. 2A and 2B indicates an example of characteristics in the case in which the switching unit includes the second bipolar transistor (TR2), and (B) shown in FIGS. 2A and 2B indicates an example of characteristics in the case in which the switching unit does not include the second bipolar transistor (TR2).

As shown in FIG. 2A, by including the second bipolar transistor (TR2), an insertion loss between the first amplifier 102 and the output terminal (Pout) in the switching unit 106 may be smaller than an insertion loss between the first amplifier 102 and the output terminal (Pout) when the switching unit 106 does not include the second bipolar transistor (TR2). In addition, as shown in FIG. 2B, by including the second bipolar transistor (TR2), IMD in the switching unit 106 may be smaller than IMD in the case in which the switching unit 106 does not include the second bipolar transistor (TR2).

(2) When the switching unit 106 is turned on, in the case in which the first amplifier 102 is not operated and the second amplifier 104 is operated, the following may be provided.

For example, when a voltage level of a control voltage (Vc0) is a high level, and a voltage level of a control voltage (Vc1) is a low level, the first bipolar transistor (TR1) and the second bipolar transistor (TR2) are turned off. Accordingly, an insertion loss between the second amplifier 104 and the output terminal (Pout), that is, an insertion loss of a signal path relating to the second amplifier 104 may be relatively further reduced.

Here, in FIG. 1, the switching unit according to the embodiment of the present invention is not provided between the first amplifier 102 and the output terminal (Pout), that is, on a signal path relating to the first amplifier 102, but this is because a size of a transistor of the first amplifier 102 is larger than a size of a transistor of the second amplifier 104, thereby suppressing an influence at the point (B) shown in FIG. 1 by using an impedance provided when the first amplifier 102 is not operated. That is, although omitted in FIG. 1, the amplifying apparatus according to the first embodiment of the present invention may include a switch having the same configuration as that of the switching unit 106 on the signal path relating to the first amplifier 102.

The amplifying apparatus 100 according to the first embodiment of the present invention includes the switching unit 106 shown in FIG. 1, and therefore isolation in each of a signal path relating to the first amplifier 102 and a signal path relating to the second amplifier 104 may be ensured, and characteristic deterioration may be prevented.

In addition, the amplifying apparatus 100 may include a bipolar transistor respectively included in each of the first amplifier 102 and the second amplifier 104, and First and second bipolar transistors (TR1) and (TR2) included in the switching unit 106, and here, the bipolar transistors may have identical types to, for example, InGaP HBT, or the like. That is, the bipolar transistor respectively included in each of the first amplifier 102 and the second amplifier 104 and the first and second bipolar transistors (TR1) and (TR2) which are included in the switching unit 106 may be formed with a same semiconductor process. Here, "formed with a same semiconductor process" according to the embodiment of the present invention denotes that the bipolar transistor respectively included in each of the first amplifier 102 and the second amplifier 104, and the first and second bipolar transistors (TR1) and (TR2) included in the switching unit 106, are formed with the same semiconductor process at the same time, or separately formed at different times.

Accordingly, in the amplifying apparatus 100, possibilities of an increase in a size of the amplifying apparatus (or an amplification module), an increase in costs, and an increase in imbalance at the time of assembly, which may be generated when the amplifier and the switch include a plurality of other semiconductor chips manufactured by a different semiconductor process, may be reduced. In addition, the amplifying apparatus 100 may prevent the increase in costs due to an increase in a process price such as when a complex process which can configure InGaP HBT and HEMT as a single chip is used.

Accordingly, the amplifying apparatus 100 may prevent characteristic deterioration while reducing the increase in costs.

Second Embodiment

Figure 3:
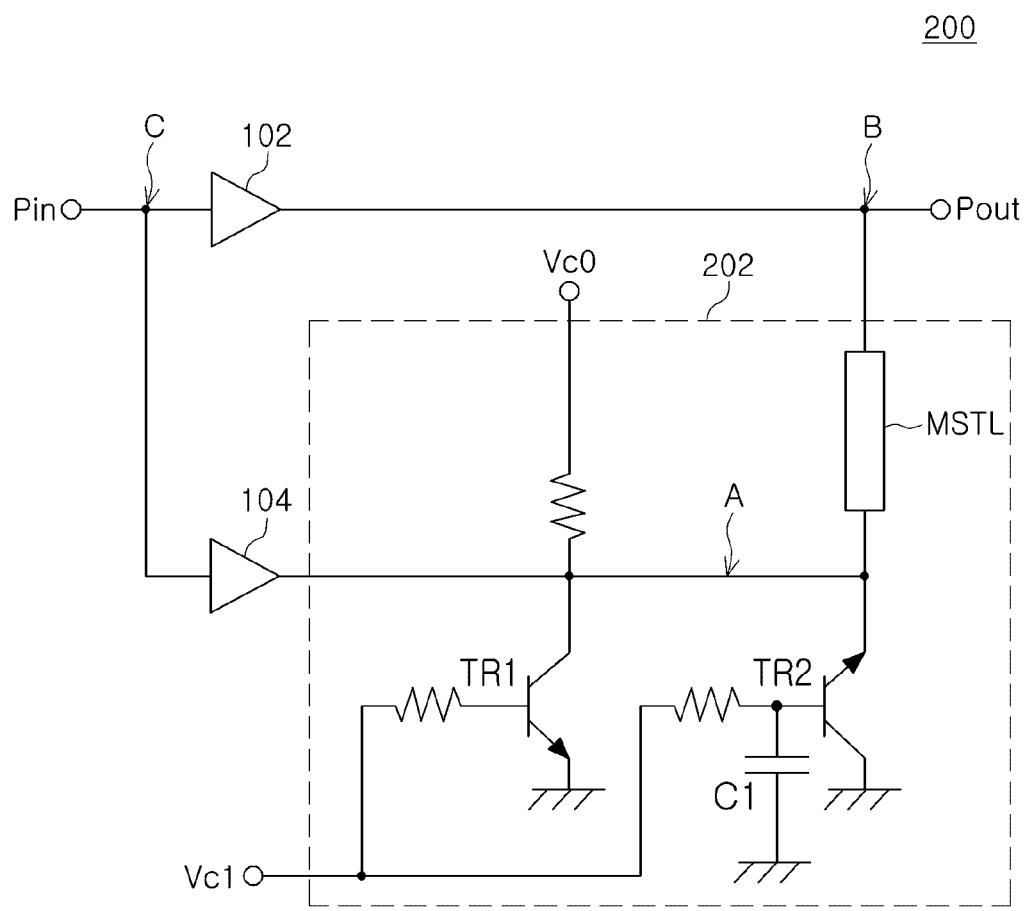
FIG. 3 is a graph illustrating an example of configurations of an amplifying apparatus according to a second embodiment of the present invention.

A configuration of the amplifying apparatus according to the embodiment of the present invention is not limited to the configuration shown in FIG. 1. FIG. 3 is a circuit diagram illustrating an example of configurations of an amplifying apparatus 200 according to a second embodiment of the present invention.

Here, in comparing the amplifying apparatus 200 with the amplifying apparatus 100 according to the first embodiment shown in FIG. 1, the amplifying apparatus 200 basically has the same configuration as that of the amplifying apparatus 100 shown in FIG. 1, but the configuration of a switching unit 202 is different from the switching unit 106 shown in FIG. 1. More specifically, the switching unit 202 may further include a capacitor C1 of which one end is connected to a base of the second bipolar transistor (TR2), and the other end is grounded, in addition to the configuration of the switching unit 106 shown in FIG. 1.

The capacitor (C1) may serve to reduce possibilities of an increase in an insertion loss between the second amplifier 104 and the output terminal (Pout) and occurrence of deterioration of distortion in a case in which the switching unit 202 is in an on state (that is, both the first bipolar transistor (TR1) and the second bipolar transistor (TR2) are in an off state).

Here, when the switching unit 202 is in the on state, the second bipolar transistor (TR2) needs to maintain the off state. However, in the case in which the switching unit 202 does not include the capacitor (C1), high-frequency amplitude is leaked to a base of the second bipolar transistor (TR2) when the high-frequency signal input from the input terminal (Pin) is a high power signal, whereby the off state of the second bipolar transistor (TR2) may not be maintained.

On the other hand, the switching unit 202 according to the second embodiment of the present invention includes the capacitor (C1) of which one end is connected to the base of the second bipolar transistor (TR2), and the other end is grounded as shown in FIG. 3, and therefore the second bipolar transistor (TR2) may be prevented from failing to maintain the off state by stabilizing a base potential of the second bipolar transistor (TR2) with respect to high-frequency amplitude.

Here, as an example of a capacity of the capacitor (C1), a capacity short-circuited by a high-frequency may be given. More specifically, as the capacity of the capacitor (C1), a capacity of about 2 pF with respect to frequency of 1 GHz may be used. In addition, the capacity of the capacitor (C1) according to the embodiment of the present invention is not limited thereto.

Figure 4A:
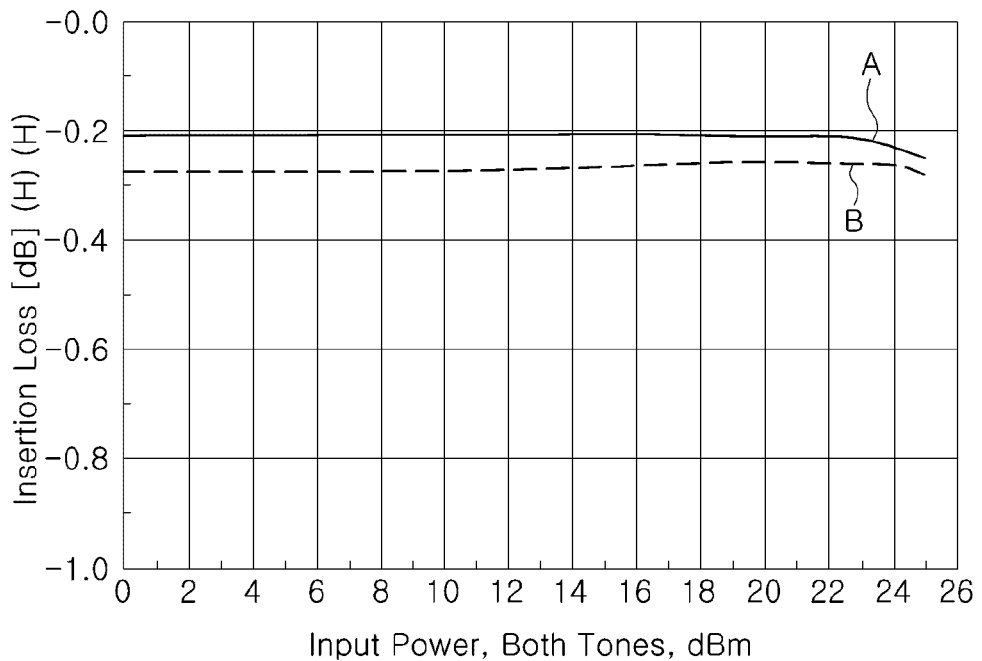
FIG. 4A is a graph illustrating effects of a capacitor included in a switching unit according to a second embodiment of the present invention.
Figure 4B:
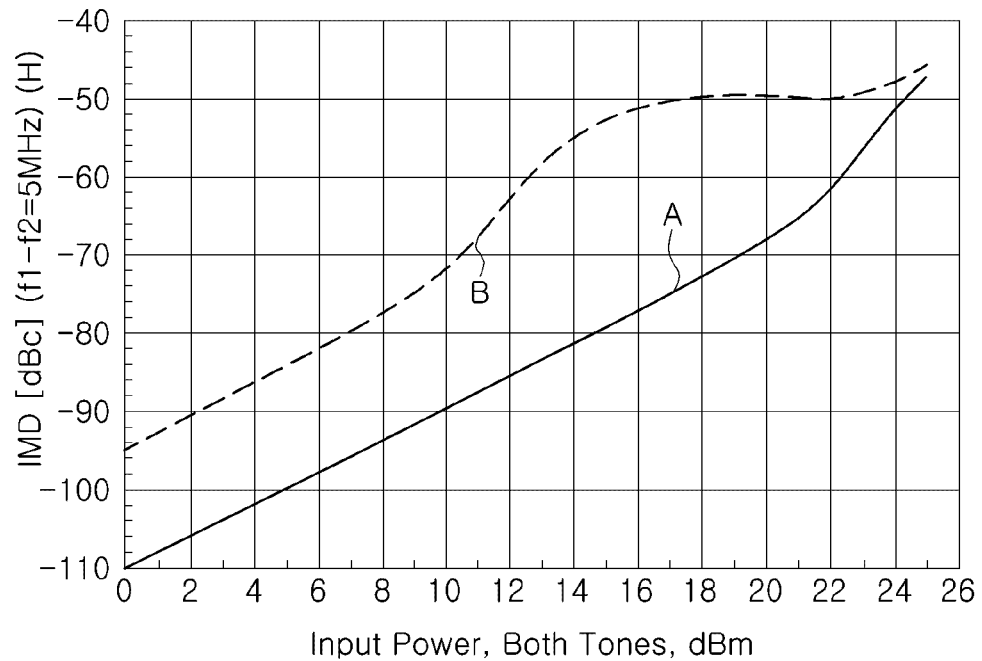
FIG. 4B is a graph illustrating effects of a capacitor included in a switching unit according to the second embodiment of the present invention.

FIGS. 4A and 4B are graphs illustrating effects of a capacitor (C1) included in a switching unit according to the second embodiment of the present invention. In FIG. 4A, an insertion loss relationship with respect to a high-frequency signal power between the second amplifier 104 and the output terminal (Pout) is respectively shown in the case in which the switching unit includes the capacitor (C1) and the switching unit does not include the capacitor (C1). In addition, in FIG. 4B, a relationship of IMD with respect to a high-frequency signal power between the second amplifier 104 and the output terminal (Pout) is respectively shown in the case in which the switching unit includes the capacitor (C1) and the switching unit does not include the capacitor (C1). Here, (A) shown in FIGS. 4A and 4B indicates an example of characteristics in the case in which the switching unit includes the capacitor (C1) and (B) shown in FIGS. 4A and 4B indicates an example of characteristics in the case in which the switching unit does not include the capacitor (C1).

As shown in FIG. 4A, by including the capacitor (C1), an insertion loss between the second amplifier 104 and the output terminal (Pout) in the switching unit 202 may be smaller than an insertion loss between the second amplifier 104 and the output terminal (Pout) in the case in which the switching unit 202 does not include the capacitor. In addition, as shown in FIG. 4B, by including the capacitor (C1), IMD in the switching unit 202 may be smaller than IMD in the case in which the switching unit 202 does not include the capacitor (C1).

The amplifying apparatus 200 according to the second embodiment of the present invention may have the configuration shown in FIG. 3, and therefore distortion with respect to amplitude of a high-frequency signal may be further reduced in the amplifying apparatus 200, as compared to the amplifying apparatus 100 according to the first embodiment shown in FIG. 1, and switching in the switching unit 202 may be achieved. In addition, the amplifying apparatus 200 may have the configuration shown in FIG. 3, and therefore distortion may be reduced even in the case in which the high-frequency signal is a high power signal.

In addition, the amplifying apparatus 200 basically has the same configuration as that of the amplifying apparatus 100 according to the first embodiment shown in FIG. 1. Accordingly, in the similar manner as that of the amplifying apparatus 100 shown in FIG. 1, the amplifying apparatus 200 may prevent characteristic deterioration while reducing costs.

Another Embodiment

A configuration of the amplifying apparatus according to the embodiments of the present invention is not limited to the configuration according to the first embodiment shown in FIG. 1 or the configuration according to the second embodiment shown in FIG. 3.

For example, a configuration example of switching two output powers is provided in FIGS. 1 and 3, but the amplifying apparatus according to the embodiments of the present invention may include the switching unit according to the embodiments of the present invention between each amplifier and the output terminal, and therefore a configuration of switching at least three output powers may be used.

In addition, the amplifying apparatus according to the embodiments of the present invention may further include the switching unit according to the embodiments of the present invention on an input side (for example, the point (C) side of FIGS. 1 and 3) of each amplifier.

As such, the amplifying apparatus according to the embodiments of the present invention has been described, but the embodiments of the present invention are not limited thereto. The embodiments of the present invention may be applied to a variety of devices which can process high-frequency signals such as a communications device such as a mobile phone or a smart phone, a computer such as a PC (Personal Computer) or a server, a display device such as a television set, video/music players (or video/music recording device), etc. In addition, the embodiments of the present invention may be applied to an amplification module (or amplification IC (Integrated Circuit)) which can be incorporated into the above-described devices.

For example, the switching unit according to the embodiments of the present invention included in the amplifying apparatus according to the embodiments of the present invention may be configured with an equivalent circuit of the switching unit 100 shown in FIG. 1 and the switching unit 200 (including a switch according to a modified example) shown in FIG. 3.

As set forth above, according to the embodiments of the present invention, characteristic deterioration may be prevented while a reduction in costs is achieved.

While the present invention has been shown and described in connection with the embodiments, it will be apparent to those skilled in the art that modifications and variations can be made without departing from the spirit and scope of the invention as defined by the appended claims.

What is claimed is:
1. An amplifying apparatus comprising:
    a first amplifier connected between an input terminal to which a high-frequency signal is input and an output terminal through which the high-frequency signal is output, including a bipolar transistor, and amplifying the high-frequency signal input from the input terminal;
    a second amplifier including a bipolar transistor, amplifying the high-frequency signal input from the input terminal, and having a lower maximum output power than that of the first amplifier; and
    a switching unit connected between the second amplifier and the output terminal, and selectively outputting the high-frequency signal amplified by the second amplifier through the output terminal,
    the switching unit including:
        an impedance transformer installed on a signal line between the second amplifier and the output terminal, and performing impedance conversion,
        a first bipolar transistor in which an emitter is grounded, a collector is connected to the signal line, and a current according to a control voltage for controlling a switching operation in the switching unit is applied to a base, and
        a second bipolar transistor in which a collector is grounded, an emitter is connected to the signal line, and the current according to the control voltage is applied to a base.
2. The amplifying apparatus of claim 1, wherein the switching unit further includes a capacitor of which one end is connected to the base of the second bipolar transistor, and the other end is grounded.
3. The amplifying apparatus of claim 1, wherein the bipolar transistors included in the first and second amplifiers, and the first and second bipolar transistors included in the switching unit, are formed with a same semiconductor process.

* * * * *